US006275104B1

(12) United States Patent
Holter

(10) Patent No.: US 6,275,104 B1
(45) Date of Patent: Aug. 14, 2001

(54) MULTISTAGE AMPLIFIER WITH LOCAL ERROR CORRECTION

(75) Inventor: Bent Holter, Oslo (NO)

(73) Assignee: Hegel AS, Oslo (NO)

( * ) Notice: Subject to any disclaimer, the term of this patent is extended or adjusted under 35 U.S.C. 154(b) by 0 days.

(21) Appl. No.: 09/540,538

(22) Filed: Mar. 31, 2000

(51) Int. Cl.[7] ................................................ H03F 1/26
(52) U.S. Cl. ......................... 330/149; 330/136; 330/110
(58) Field of Search ................................ 330/107, 129, 330/136, 149, 151, 110, 150, 152

(56) References Cited

U.S. PATENT DOCUMENTS

| 3,825,854 | 7/1974 | Pichal | 330/149 |
| 4,178,555 | 12/1979 | Temer | 328/162 |
| 4,379,994 | 4/1983 | Bauman | 330/149 |
| 4,679,251 | * 7/1987 | Chown | 330/110 |
| 4,710,727 | 12/1987 | Rutt | 330/149 |
| 4,816,711 | * 3/1989 | Roza | 330/149 |
| 5,030,925 | * 7/1991 | Taylor | 330/110 |
| 5,302,911 | * 4/1994 | Miyashita | 330/110 |
| 6,069,257 | 5/2000 | Maruyama | 330/151 |

FOREIGN PATENT DOCUMENTS 11-261343   9/1999   (JP).

* cited by examiner

*Primary Examiner*—Robert Pascal
*Assistant Examiner*—Khanh Van Nguyen
(74) *Attorney, Agent, or Firm*—Wenderoth, Lind & Ponack, L.L.P.

(57) ABSTRACT

An amplifier stage in a series connection of such stages in a low or medium frequency analog amplifier construction, e.g. for audio, is provided with correction circuitry for dynamic cancellation of non-linearities in the stage output. The correction circuitry includes a threshold detector feeding a correction signal to an adder circuit that is inserted in the series connection. An input signal to the threshold detector is supplied from a junction where e.g. resistors coupled respectively to an input and an output of the stage, meet.

13 Claims, 5 Drawing Sheets

MULTISTAGE AMPLIFIER WITH LOCAL ERROR CORRECTION

BACKGROUND OF THE INVENTION

1. Field of the Invention

This invention relates to an analog amplifier construction, preferably a multi-stage amplifying device with high linearity. The amplifier topology has applications in high dynamic range amplifier systems for low and medium frequencies.

2. Description of the Related Art

Traditionally, global feedback has been used to reduce non-linearities for amplifiers consisting of several cascaded amplifier stages. FIG. 1 shows such a global feedback amplifier. Each of the gain stages G1, G2 and G3 will have a phase shift, and to maintain stability when closing the feedback loop it is necessary to include a compensation capacitor Cc to give the amplifier a sufficient phase margin to avoid oscillations when driving reactive loads. For amplifiers driving highly capacitive or inductive loads such as loudspeakers or motors, the phase compensation has to be increased to have a sufficient stability margin for the worst case reactive load. Such a frequency compensation method will reduce the amount of loop gain available for reduction of non-linearities at high frequencies. A loop gain plot is shown in FIG. 2, showing that there is not much loop gain LG2 for reducing non-linearities at the frequency F2. The loop gain at F2 is about 10 dB, giving about $\frac{1}{100}$ of reduction of non-linearities compared to the reduction at the frequency F1. At low frequencies such as F1 the loop gain is substantial with about 50 dB of loop gain to correct non-linearities.

Global feedback amplifiers do also have three other types of drawbacks:

The connected output cable feeding the connected load will act as an antenna, and will pick up radio frequency disturbances. These RF disturbances will reach the output of the amplifier, and will also reach the negative input terminal of the input stage of the amplifier through the feedback network. The RF signal will be rectified by the transistors in the input stage and will shift bias of the amplifying stages. This will increase distortion of the amplifier circuit.

Current kick-back from the connected reactive loads of the amplifier will reach the output of the amplifier. This kick-back will also reach the input stage through the feedback network, and will disturb the operation of the input stage.

The time delay of the amplifying stages will result in a delayed feedback signal to the negative input terminal of the input stage. To avoid generating transient intermodulation in the input stage, the input signal to the amplifier must be bandwidth limited according to the forward path time delay properties of the amplifying stages. In an amplifier driving highly reactive loads, the frequency compensation necessary to insure stable operation will result in larger delays and phase shifts through the amplifier, and hence the bandwidth limiting of the input signal must be increased. Because of this, the overall bandwidth of such a global feedback amplifier will be restricted.

To solve the problem of global feedback amplifiers it has previously been suggested to make a cascaded amplifier as shown in FIG. 3.

This topology solves some problems, but will also introduce some new problems.

The bandwidth of such an amplifier can be increased because there is no need for limiting the bandwidth of the input signal to avoid transient intermodulation in the input stage. The input stage will not be disturbed by RF signals present on the cable connected to the output of the amplifier, as the RF signals will be on the output transistors only. The kick-back from the connected reactive load will not reach the input stage.

The main disadvantage by using the cascaded stages in FIG. 3 is that the non-linearities of the different amplifying stages will be too large to make a high dynamic range linear amplifier for both low and high frequencies when amplifying both weak and strong signals. Often the linearity when amplifying weak signals can be sufficient, but the linearity will decrease when amplifying large signals, because of the voltage and current dependent non-linearities of the semiconductors used in the amplifying stages at high voltage swings and high output current. The output impedance of the output stage will not be sufficiently low to make the frequency response flat when connected to a load with frequency dependent impedance, such as a loudspeaker. This will give frequency dependent amplitude deviations from flat frequency response, and hence a coloring of the amplifier's sonic signature dependent on the connected loudspeaker load.

Error correction networks for single amplifier stages have been proposed earlier, see for example U.S. Pat. No. 5,179,352. However, U.S. Pat. No. 5,179,352 uses complex circuits like differential amplifiers to perform continuous error correction. The U.S. Pat. No. 5,179,352 circuit will only work for non-inverting voltage gains near 1. There is however a need of improved amplifiers with error correction for inverting and non-inverting gain stages with up to 60 dB of gain.

SUMMARY OF THE INVENTION

The object of this invention is to combine the best characteristics of global feedback amplifiers as shown in FIG. 1 and local (internal) feedback amplifiers as shown in FIG. 3. In addition this invention will increase linearity at high output levels of voltage and current, especially at high frequencies where global feedback topologies do not have very much loop gain to reduce non-linearities.

By using several amplifier stages connected in series, where each stage has a specialized voltage and current gain function, the desired total amplifier transfer function can be obtained. Each single gain stage has local error correction, and this error correction is dynamically adjusted to cancel non-linearities in case the applied input signal will cause sufficient non-linearity for one or more of the cascaded gain stages. Hence no error correction is done when the amplifying stages do not contribute to non-linearity, and a threshold level is set by individual threshold detectors in respective local error correction loops. When no error correction is performed, the gain stages are working as cascaded local feedback gain stages with the specified voltage and current gain. The respective stages that are error corrected may have a different amount of voltage and current gain, and each of these stages can either be inverting or non-inverting gain stages.

The multistage error correction circuitry in accordance with the invention is made in the simplest possible way using only resistors, buffers and threshold detectors to constitute the correcting networks. The error correction networks are only active when correction is necessary. The amount of error initiating error correction is set to a predetermined level. The proposed error correction topology includes the strengths of both global feedback topologies and local feedback topologies, without introducing the drawbacks of these two topologies.

The present invention has non-linearity dependent error correction in such a way that for small and medium signals the circuit will work as a cascaded local feedback amplifier without error correction. When the non-linearities reach a certain predetermined level, the error correction circuit will dynamically correct for the stage error by correcting the local stage causing the non-linearity. Because of the distributed local error correction topology, the signal delay through respective amplifying stages is kept low, and hence the error correction speed is much higher than in a global feedback amplifier. This gives increased linearity end error correction capabilities for high frequency signals compared to the global feedback approach.

DESCRIPTION OF PREFERRED EMBODIMENTS

Figure 1:
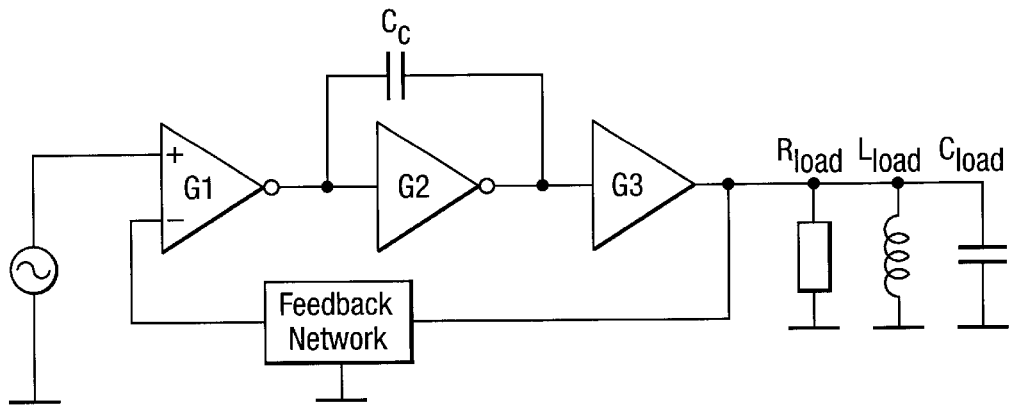
FIG. 1 shows a general global feedback amplifier.
Figure 2:
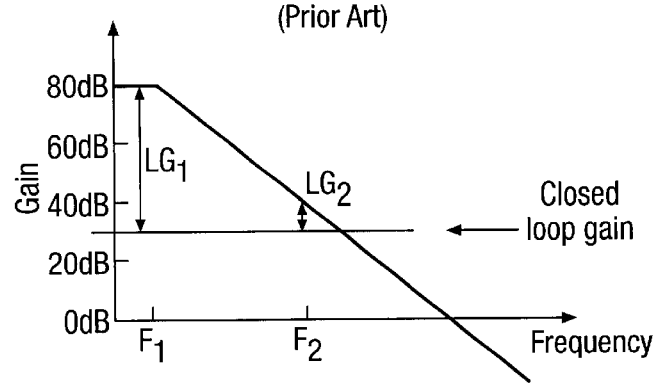
FIG. 2 shows the open loop- and feedback loop gain of a general global feedback amplifier.
Figure 3:
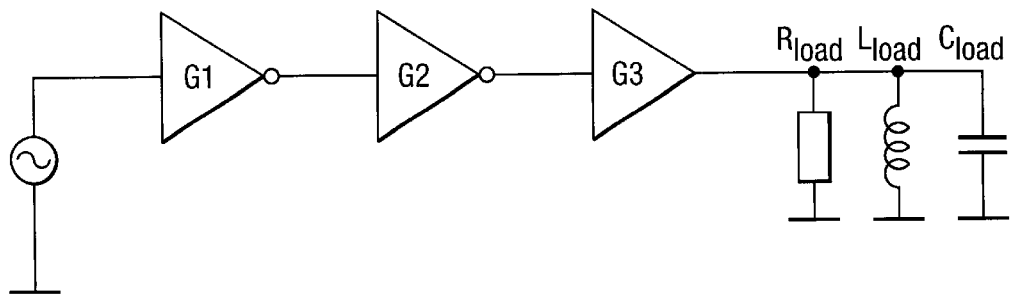
FIG. 3 shows a general cascaded local feedback amplifier topology.

An example of an amplifier device which constitutes a first embodiment of this invention, will be described with reference to FIG. 4. This gives an example of an amplifier having three gain blocks 3, 7 and 11. The first gain block 3 is an inverting gain stage with a gain of G1. The second gain block 7 is a non-inverting gain stage with gain G2. The third gain stage 11 is an inverting gain stage with gain G3. The connected reactive load is exemplified by the parallel connection of Rload, Cload and Lload.

The first error correction stage consists of the resistors RI and R2 summing the input and output of gain stage 3 to the node 12. The ratio between the resistor values (resistances) is calculated in such a way that node 12 is representing only the non-linearity error signal from gain stage 3. When the absolute value of the gain of block 3 is G1, then R2=G1*R1. If gain stage 3 contributes with no non-linearity node 12 will have no error signal component.

If the level of the error signal is larger than a predetermined threshold level, the threshold detector 4 will output an error signal that is summed with the input signal 1 in the addition circuit 2. If the error signal is below the predetermined threshold level, then the output of the threshold detector is high impedance. The gain stage 3 will work as an open loop gain circuit when the error signal is less than the level set in the threshold detector. When the error signal level in node 12 is decided to be higher in level than the predetermined level set for applying error correction, the gain stage 3 will work together with R1, R2, the threshold detector 4 and addition circuit 2 to form a local error pre-distortion loop to correct the error.

The second error correction stage consists of resistors R3 and R4 summing the input of gain stage 7 and the inverted and unity gain buffered output of gain stage 7 to the node 14. Buffer 8 is a unity gain inverting buffer with high input impedance and low output impedance. The ratio between the resistor values is calculated in such a way that node 14 is representing only the non-linearity error signal from gain stage 7. When the value of gain in block 7 is G2, then R4=G2*R3. If gain stage 7 contributes with no non-linearity, node 14 will have no error signal component.

If the level of the error signal is larger than the predetermined threshold level, threshold detector 6 will output an error signal that is summed with the output signal of stage 3 in the addition circuit 5. The gain stage 7 will work as an open loop gain circuit when the error signal is less than the level set in the threshold detector. When the error signal level in node 14 is decided to be higher in level than the predetermined level set for applying error correction, gain stage 7 will work together with buffer 8, resistors R3, R4, threshold detector 6 and addition circuit 5 to form a local error pre-distortion loop to correct the error.

The third error correction stage consists of resistors R5 and R6 summing the input and output of gain stage 11 to the node 16. The third stage will work in a manner similar to the first gain stage 3.

Figure 4:
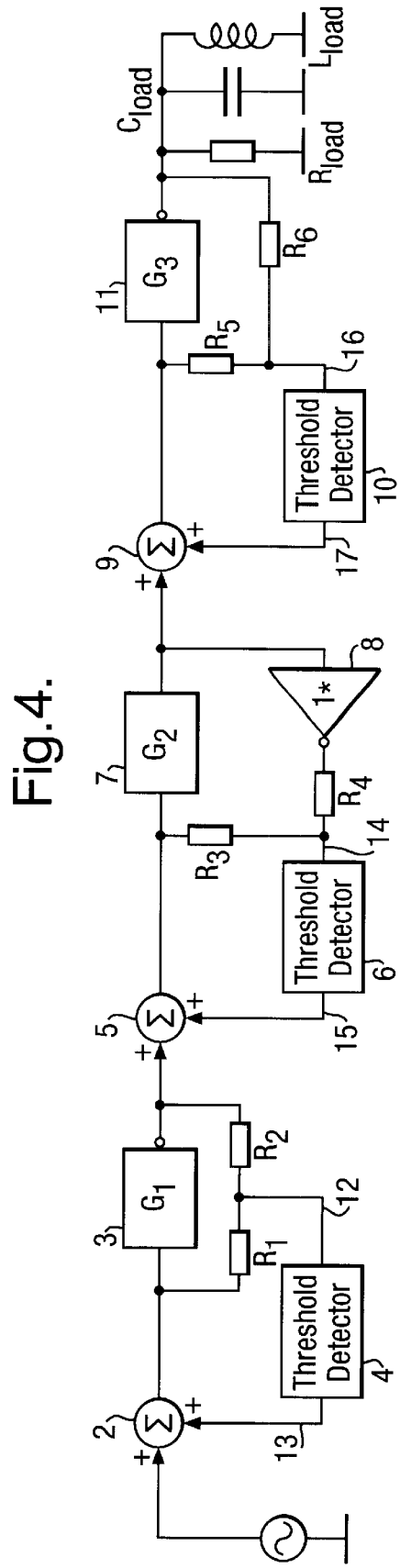
FIG. 4 shows in a block diagram an amplifier circuit representing a first embodiment of the invention.

In the circuit in FIG. 4 the threshold detectors 4, 6 and 10 will dynamically decide which of the amplifier stages needs error correction to preserve the processed signal without degrading the, quality by non-linear amplifier stage operation. In this circuit example it will be the last stage 11 that is handling the largest signal and driving the reactive load, so this stage will normally be the stage needing most error correction.

An example of an amplifier device which constitutes a second embodiment of this invention, will be described with reference to FIG. 5. This gives an example of an amplifier having four gain stages 3, 7, 11 and 18, summing the error correction signals that are higher than the predetermined threshold level to the addition circuits 2, 8 and 13.

The first gain block 3 is an inverting gain stage with a gain of G1. The second gain block 7 is an inverting gain stage with gain G2. The third gain stage 11 is an inverting gain stage with gain G3. The unity gain buffer 18 is separating the addition stage 13 from the connected reactive load exemplified by the parallel connection of Rload, Cload and Lload. The first error correction stage consists of resistors R1 and R2 summing the input and output of gain stage 3 to node 12. The ratio between the resistor values is calculated in such a way that node 12 is representing only the non-linearity error signal from gain stage 3. When the absolute value of gain in block 3 is G1, then R2=G1*R1. If gain stage 3 contributes with no non-linearity, node 12 will have no error signal component. The gain stage 5 with gain G1 amplifies the error signal before applying it to threshold detector 4. If the level of the error signal is larger than the predetermined threshold level, threshold detector 4 will output an error signal that is summed with the output signal of gain stage 3 in addition circuit 2. The gain stage 3 will work as an open loop gain circuit when the error signal is less than the level set in the threshold detector. When the error signal level in node 12 amplified by gain stage 5 is decided to be higher in level than the predetermined level set for applying error correction, gain stage 3 will work together with the resistors R1, R2, gain stage 5, threshold detector 4 and addition circuit 2 to form a local error post-distortion correction loop to correct the error of gain stage 3. The amplifying stage 5 will be handling only the low level error signal from gain stage 3, and this relaxes the performance requirements for this stage.

The combined signal delay of gain stage 5 and threshold detector 4 is adjusted to be the same signal delay as in gain stage 3. This is to ensure that the error correction signal is added in phase with the amplified signal through gain stage 3. This is important for in-phase error correction at medium and high frequencies.

The second error correction stage consists of resistors R3 and R4 summing the input and output of gain stage 7 to node 14. The ratio between the resistor values is calculated in such a manner that node 14 is representing only the non-linearity error signal from gain stage 7. When the value of gain in block 7 is G2, then R4=G2*R3. If gain stage 7 contributes with no non-linearity, node 14 will have no error signal component. Gain stage 10 with gain G2 amplifies the error signal before applying it to the threshold detector 4. If the level of the error signal from stage 7 is larger than the predetermined threshold level, threshold detector 9 will output an error signal that is summed with the output signal of gain stage 7 in addition circuit 8. The gain stage 7 will work as an open loop gain circuit when the error signal is less than the level set in the threshold detector. When the error signal level in node 14, amplified by gain stage 10, is decided to be higher in level than the predetermined level set for applying error correction, gain stage 7 will work together with the resistors R3, R4, gain stage 10, threshold detector 9 and addition circuit 8 to form a local error post-distortion correction loop to correct the error. The amplifying stage 10 will be handling only the low level error signal from gain stage 7, and this relaxes the performance requirements for this stage.

The combined signal delay of gain stage 10 and the threshold detector 9 is adjusted to be the same signal delay as in gain stage 7.

The third error correction stage consists of the resistors R5 and R6 summing the input and output of gain stage 11 to node 16. The third stage will work in a manner similar to the second gain stage 7 with surrounding circuitry. The error correction signal from the output of the threshold detector 17 is added to the addition circuit 13. The amplifying stage 15 will be handling only the low level error signal from gain stage 11, and this relaxes the performance requirements for this stage. The combined signal delay of gain stage 15 and threshold detector 17 is adjusted to be the same signal delay as in gain stage 11.

The unity gain output buffer 18 has got its own error correction loop formed by an inverting unity gain buffer 19, summing resistors R7 and R8, threshold detector 20 and addition circuit 13. The operation of this error correction loop goes in the same way as for the other gain stages, except that R7=R8, due to the unity gain of buffer 18.

Figure 5:
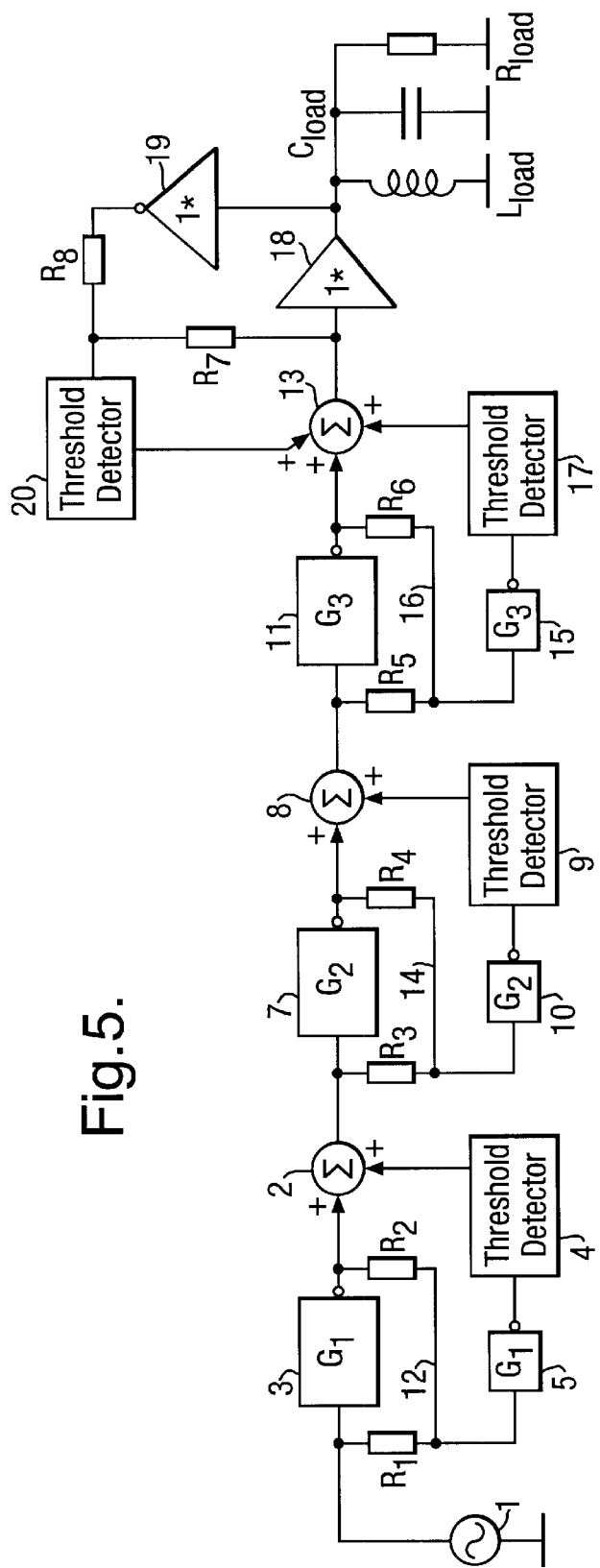
FIG. 5 shows in a block diagram an amplifier circuit representing a second embodiment of the invention.

In the circuit in FIG. 5, the threshold detectors 4, 9, 17 and 20 of the respective gain stages 3, 7, 11 and 18 will dynamically decide which of the amplifier stages needs error correction to preserve the processed signal without degrading the quality by non-linear amplifier stage operation.

An example of an amplifier device which constitutes a third embodiment of the present invention, will be described with reference to FIG. 6. This gives an example of an amplifier having four gain stages 3, 7, 11 and 18, and in which amplifier error correction signals are summed to a common addition circuit before the input of the last unity gain buffer stage, to give less circuit complexity than the example in FIG. 5.

The first gain block 3 is an inverting gain stage with a gain of G1. The second gain block 7 is an inverting gain stage with gain G2. The third gain stage 11 is an inverting gain stage with gain G3. The unity gain buffer 18 is separating the addition circuit 2 from the connected reactive load exemplified by the parallel connection of Rload, Cload and Lload.

The first error correction stage consists of resistors R1 and R2 summing the input and output of gain stage 3 to node 12. The ratio between the resistor values is calculated in such a way that node 12 is representing only the non-linearity error signal from gain stage 3. When the absolute value of gain in block 3 is G1, then R2=G1*R1. If gain stage 3 contributes with no non-linearity, node 12 will have no error signal component.

If the level of the error signal amplified by gain stage 8 is larger than the predetermined threshold level, the threshold detector 4 will output an error signal that is summed with the output signal of gain stage 11 in addition circuit 2. The gain stage 3 will work as an open loop gain circuit when the error signal is less than the level set in the threshold detector. When the error signal level in node 12 is decided to be higher in level than the predetermined level set for applying error correction, gain stage 3 will work together with R1, R2, the threshold detector 4 and the addition circuit 2 to form a local error post-distortion loop to correct the error. Gain stage 8 has a gain G1*G2*G3 to compensate for the gain in the forward path of stages 3, 7 and 11. Gain stage 8 has got high input impedance and low output impedance. This ensures that the error correction signal for gain stage 3 added in summer 2 is compensated for the gain in stages 3, 7 and 11. The combined signal delay of gain stage 8 and threshold detector 4 is adjusted to be the same delay as the forward delay of stages 3, 7 and 11. The second error correction stage consists of resistors R3 and R4 summing the input and output of gain stage 7 to node 14. The ratio between the resistor values is calculated in such a way that node 14 is representing only the non-linearity error signal from gain stage 7. When the value of gain in block 7 is G2, then R4=G2*R3. If gain stage 7 contributes with no non-linearity, node 14 will have no error signal component. Gain stage 9 has a gain G2*G3 to compensate for the gain in the forward path of stages 7 and 11. Gain stage 9 has got high input impedance and low output impedance. This ensures that the added error correction signal for gain stage 7 added in summer 2 is compensated with respect to the gain in stages 7 and 11. The combined signal delay of gain stage 9 and threshold detector 6 is adjusted for same delay as the forward delay of stage 7 and 11. If the level of the error signal from stage 7 is larger than the predetermined threshold level, the threshold detector 6 and gain stage 9 will output an error signal that is summed with the input signal in the addition circuit 2. The gain stage 7 will work as an open loop gain circuit when the error signal is less than the level set in the threshold detector. When the error signal level in node 14 is found to be higher than the predetermined level set for applying error correction, gain stage 7 will work together with gain stages 9, resistors R3, R4, threshold detector 6 and addition circuit 2 to form a local error post-distortion loop to correct the error. The third error correction stage consists of resistors R5 and R6 summing the input and output of gain stage 11 to node 16. The third stage will work in a manner similar to the second gain stage 7. The error correction signal from the output of threshold detector 10 is added to the addition circuit 2. The unity gain output buffer 18 has got its own error correction loop formed by an inverting unity gain buffer 19, summing resistors R7 and R8, threshold detector 20 and addition circuit 2. Operation of this error correction loop is in the same way as for the other gain stages, except that R7=R8, due to the unity gain of the buffer 18.

Figure 6:
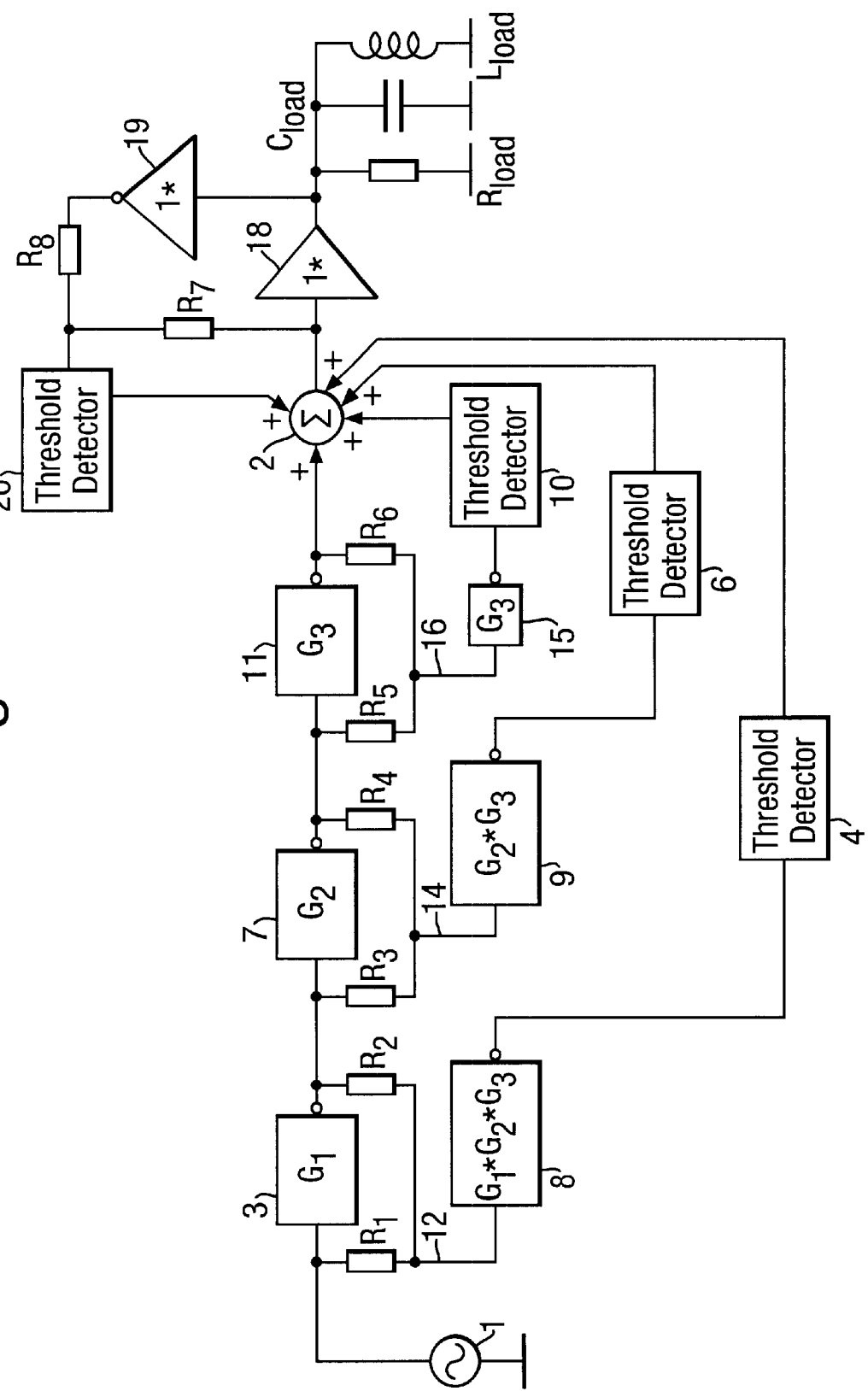
FIG. 6 shows in a block diagram an amplifier circuit representing a third embodiment of the invention.

In the circuit in FIG. 6 the threshold detectors 4, 6, 10 and 20 of the different gain stages 3, 7, 11 and 18 will dynamically decide which of the amplifier stages needs error correction to preserve the processed signal without degrading the quality by non-linear amplifier stage operation.

In the above text, it may seem that the threshold detector works only with respect to signal levels. However, this detector is intended to work according to various principles.

The threshold detector is a block that determines if an input signal satisfies the following listed characteristics:

The magnitude of the input signal level is higher than a set trip level.

The magnitude of the trip level can be a function of input signal frequency.

The magnitude of trip level can be dependent on the combination of different spectral components and the level differences between these different spectral components of the input signal.

If these characteristics of the input signal are fulfilled then the detector will output a low impedance replica of its input signal. If not, the output of the threshold detector will be in high impedance mode.

Of course the above examples constitute merely embodiments of the invention. The number of amplifier stages can be adapted to special needs, and correction networks can be combined in manners that will be apparent for persons skilled in the art. As is apparent from the embodiment presented in FIG. 5, correction signals can be inserted into the series connection both in a feedback and a feed forward fashion at the same time in one and the same amplifier construction. Also combinations using the solution presented in FIG. 6 (i.e. a "layered" configuration of corrections "from inside to outside") together with a solution as e.g. in FIG. 4 for other stages, will be feasible.

Figure 7:
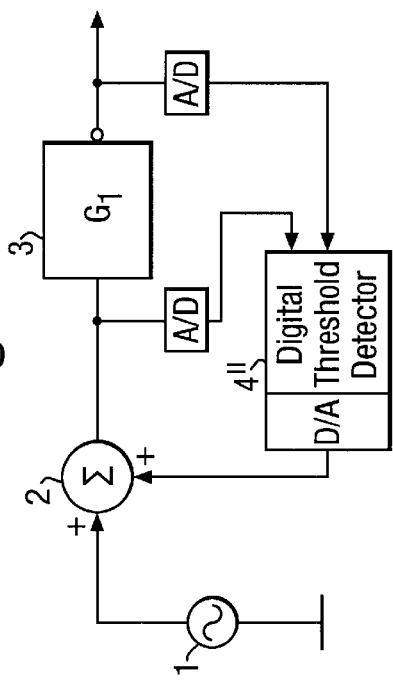
FIG. 7 shows an embodiment in which an amplifier stage has a correction network operating part digitally.
Figure 8:
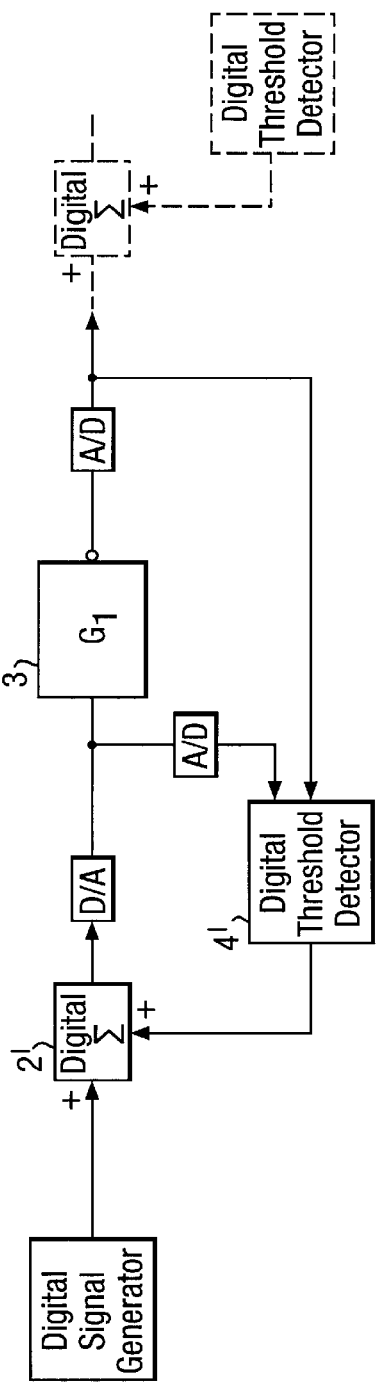
FIG. 8 shows an all digitally operating correction network.

Another possible embodiment of the invention consists in an implementation of the error correction network in which one or more parts of the error correction network operate in the digital domain:

a) The threshold detector may have an analog to digital converter input from the junction of the two sense resistors, and then do the necessary processing of threshold limits in the digital domain using digital signal processing. The output of the threshold detector will route the analog input to the output of the threshold detector as an analog signal when the threshold is reached.

b) The two sampling resistors from input and output of the analog amplifier block may be replaced by two analog to digital converters connected to the input and output of the analog amplifier block, see FIG. 7. Theses two ADC's must have sufficient resolution and sampling frequency for the application. These ADC outputs are then fed to a digital threshold detector. The necessary processing of threshold limits will then be performed in the digital domain using digital signal processing. The output of the threshold detector will use a digital to analog converter to output the necessary analog error correcting signal to the analog adder circuit.

c) In an all-digital error correction implementation (see FIG. 8) the threshold detector may have a digital output to a digitally implemented adder circuit. In this configuration the only analog stage would be the analog amplifier block needing error correction. The adder, the threshold detector and the two signal sensors from the input and the output of the analog amplifier stage would be implemented digitally by using the necessary ADC's and DAC's of sufficient resolution and sampling frequency. The ADC's and DAC's used must have significant less error than the analog amplifying stage needing error correction. In this implementation the input signal to the first adder would be a digital input signal. The output of the digital adder would be converted by a DAC and fed to the analog gain stage. The output of the analog gain stage would then be fed to an ADC connected to the input of digital adder of the next stage.

What is claimed is:

1. Amplifier construction for analog signals, comprising at least one amplifier stage serially connected between an input and an output, each amplifier stage having a stage input and a stage output, wherein a non-linearity correction network associated with a respective amplifier stage comprises sensor elements connected respectively at first sensor ends to said stage input and said stage output, said sensors being interconnected at second sensor ends to a junction to provide at said junction a combined signal serving as a basis for an input signal to a threshold detector, said threshold detector being connected and operative to supply a correction signal to an adder circuit coupled into the amplifier stage series connection, thereby to counteract non-linear distortion arising in said respective amplifier stage, if a signal level of said input signal is higher than a signal threshold.

2. The amplifier construction of claim 1, wherein each sensor element is a resistor.

3. The amplifier construction of claim 1, wherein, if an amplifier stage is a non-inverting stage, an inverting buffer of unity gain is inserted between the amplifier stage output and the adjacent correction network sensor element.

4. The amplifier construction of claim 1, wherein the output from a threshold detector associated with a certain amplifier stage is coupled into an adder circuit in front of this stage, i.e. as a feedback signal.

5. The amplifier construction of claim 1, wherein a separate gain stage is inserted between said junction and said threshold detector, said gain stage having the same gain as the associated amplifier stage, and the threshold detector output is coupled into an adder circuit behind this amplifier stage, i.e. as a feed forward signal.

6. The amplifier construction of claim 1, wherein respective outputs of several threshold detectors are connected to one common adder circuit in the series connection, respective threshold detectors then having at front end gain stages for adapting the signal magnitudes to the signal level prevailing at the adder circuit.

7. The amplifier construction of claim 1, comprising both feed forward and feedback correction networks.

8. The amplifier construction of claim 1, wherein at least one of said amplifier stages is a unity gain buffer stage.

9. The amplifier construction of claim 1, wherein said signal threshold is predetermined.

10. The amplifier construction of claim 1, wherein said signal threshold is a function of input signal frequency.

11. The amplifier construction of claim 1, wherein said signal threshold is dependent on a combination of spectral components and level differences therebetween in said input signal.

12. The amplifier construction of claim 1, wherein at least one input/output pair of sensor elements is a pair of A/D-converters outputting digital signals to said threshold detector, said threshold detector being a digital threshold detector constituting said junction and outputting an analog correction signal to said adder circuit.

13. The amplifier construction of claim 1, wherein at least one input/output pair of sensor elements is a pair of A/D-converters outputting digital signals to said threshold detector, said detector being a digital threshold detector constituting said junction and outputting a digital correction signal to be added digitally in said adder circuit, said adder circuit being a digital circuit and being equipped with a D/A-converter for the signal to be amplified in the amplifier stage in question.

* * * * *